(12) United States Patent
Okudaira et al.

(10) Patent No.: US 7,517,800 B2
(45) Date of Patent: Apr. 14, 2009

(54) SEMICONDUCTOR DEVICE AND MANUFACTURING METHOD THEREOF

(75) Inventors: Tomonori Okudaira, Hyogo (JP); Takeshi Hayashi, Hyogo (JP); Hiroshi Fujiwara, Hyogo (JP); Yasushi Fujita, Hyogo (JP); Kiyoteru Kobayashi, Hyogo (JP)

(73) Assignees: Renesas Technology Corp., Tokyo (JP); Tokyo Electron Limited, Tokyo (JP)

( * ) Notice: Subject to any disclaimer, the term of this patent is extended or adjusted under 35 U.S.C. 154(b) by 305 days.

(21) Appl. No.: 11/033,739

(22) Filed: Jan. 13, 2005

(65) Prior Publication Data

US 2005/0153573 A1      Jul. 14, 2005

(30) Foreign Application Priority Data

Jan. 14, 2004      (JP)      ............................. 2004-006985

(51) Int. Cl.
*H01L 21/00*      (2006.01)
(52) U.S. Cl. ........................ 438/685; 438/681; 438/785; 427/252; 427/582; 257/E21.586
(58) Field of Classification Search ................. 438/785, 438/685, 681, 677, 909; 257/E21.586; 427/582, 427/509, 252
See application file for complete search history.

(56) References Cited

U.S. PATENT DOCUMENTS 6,274,496 B1 *   8/2001   Leusink et al. .............. 438/685
2002/0155219 A1 * 10/2002  Wang et al. ............ 427/255.391
2003/0134038 A1 *  7/2003  Paranjpe .................. 427/248.1
2004/0063275 A1 *  4/2004  Kim et al. .................... 438/240
2005/0153573 A1 *  7/2005  Okudaira et al. ............ 438/785
2005/0233093 A1 * 10/2005  Tada et al. .................. 427/569
2006/0096531 A1 *  5/2006  Ishizaka et al. ............. 118/715

FOREIGN PATENT DOCUMENTS

JP           08-279558           10/1996

OTHER PUBLICATIONS

Hirotaka Hamamura et al., "TiN Films Prepared by Flow Modulation Chemical Vapor Deposition using $TiCl_4$ and $NH_3$", Jan. J. Appl. Phys vol. 40 (2001) pp. 1517-1521.

* cited by examiner

*Primary Examiner*—Caridad M Everhart
(74) *Attorney, Agent, or Firm*—McDermott Will & Emery LLP

(57) ABSTRACT

A manufacturing method of a semiconductor device including a TiN film, including a deposition step of forming a TiN film by the CVD method, an anneal step of performing a heat treatment to the formed TiN film in an atmosphere of $NH_3$ gas, an $NH_3$ gas purge step of purging $NH_3$ gas, and a step of further repeating the deposition step, the anneal step, and the $NH_3$ gas purge step for at least one time. The deposition step is performed using titanium halide gas and $NH_3$ gas as material gases and with a deposition temperature of 300° C.-450° C. to form the TiN film by a thickness of 1 nm-5 nm for each deposition step. Thus, a semiconductor device in which generation of irregularly grown objects in the TiN film is suppressed and a manufacturing method thereof can be provided.

25 Claims, 7 Drawing Sheets

SEMICONDUCTOR DEVICE AND MANUFACTURING METHOD THEREOF

BACKGROUND OF THE INVENTION

1. Field of the Invention

The present invention relates to a semiconductor device having a titanium nitride film and a manufacturing method thereof.

2. Description of the Background Art

Conventionally, in a capacitor in which a high dielectrics of a metal oxide such as $Ta_2O_5$, $HfO_2$, $BaSrTiO_3$ or the like is used as a dielectric layer, a titanium nitride film (hereinafter referred to as a TiN film) formed by the chemical vapor deposition method (hereinafter referred to as the CVD method) has been used as an upper electrode. Generally, the manufacturing condition of this TiN film involves use of titanium halide gas (for example, $TiCl_4$ gas) and ammonium gas ($NH_3$ gas) as material gases at a deposition temperature of about 600° C.

However, in a case of an MIS (Metal Insulator Silicon) capacitor in which polysilicon is used for the lower electrode and an MIM (Metal Insulator Metal) capacitor in which metal or a metal conductive nitride is used for the lower electrode, there has been a problem that leakage current in the capacitor increases if a TiN film of the upper electrode is formed at 600° C. Accordingly, the TiN film has been formed at the deposition temperature that is lowered to 400° C.-500° C. (for example, see Japanese Patent Laying-Open No. 08-279558).

On the other hand, while the leakage current of a capacitor decreases when the deposition temperature of the TiN film is lowered to at most 500° C., an irregularly grown object is generated. Such an irregularly grown object remains as an etching residue when the TiN film that is the upper electrode is processed, whereby the upper electrode and a contact plug that otherwise should be insulated are brought into electrical contact. This may result in malfunction of the semiconductor device.

Furthermore, as for a transistor expected to be the transistor of the next generation in which a high dielectrics such as $HfO_2$ is used as a gate insulator layer, there is a need for lowering the temperature at which a TiN film to be a gate electrode is formed. Here, crystallization occurs by the thermal hysteresis of 450° C.-500° C. with the aforementioned metal oxide of high permittivity, and an electric conduction through grain boundary of crystals or defect level resulted thereby may undesirably increase the leakage current. On the other hand, when the deposition temperature of the TiN film is lowered to at most 400° C., a large number of irregularly grown objects are generated in the TiN film. Accordingly, if tungsten (hereinafter referred to as W) or the like is further embedded as a gate electrode, the cross section of W is reduced at the portion where the irregularly grown objects are present in the TiN film and current focuses to W having smaller electric resistance as compared to TiN, whereby the electromigration life is significantly reduced.

SUMMARY OF THE INVENTION

An object of the present invention is to provide a semiconductor device in which generation of an irregularly grown object in a TiN film is suppressed even when the deposition temperature of the TiN film is lowered to at most 450° C., and further to at most 400° C. in the CVD method, and a manufacturing method thereof.

The present invention is a manufacturing method of a semiconductor device including a TiN film, including: a deposition step of forming a TiN film by CVD method; an anneal step of performing a heat treatment to the formed TiN film in an atmosphere of ammonium gas; an ammonium gas purge step of purging ammonium gas; and a step of further repeating the deposition step, the anneal step, and the ammonium gas purge step for at least one time. The deposition step is performed using titanium halide gas and ammonium gas as material gases, and under a condition of a deposition temperature of 300° C. -450° C., a deposition pressure of 10 Pa-100 Pa, a partial pressure of titanium halide gas of 1 Pa-10 Pa, and a partial pressure of ammonium gas of 9 Pa-99 Pa. The TiN film is formed by a thickness of 1 nm-5 nm for each deposition step, and the anneal step is performed for 2 seconds to 60 seconds.

As above, according to the present invention, even when the deposition temperature of the TiN film is lowered to at most 450° C. and further to at most 400° C. in the CVD method, a semiconductor device in which generation of an irregularly grown object in an TiN film is suppressed and a manufacturing method thereof can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described based on the drawings. In first to third embodiments, a manufacturing method of a semiconductor device according to the present invention will be described referring to FIGS. 1-3. In each FIGS. 1-3, abscissa indicates time, whereas ordinate indicates the partial pressure of material gases. In the figures, D indicates a deposition step of forming a TiN film by the CVD method, A indicates an anneal step of performing a heat treatment to a titanium nitride film in an ammonium gas atmosphere, AP indicates an ammonium gas purge step of purging ammonium gas, and DP indicates a material gas purge step of purging a material gas.

First Embodiment

Figure 1:
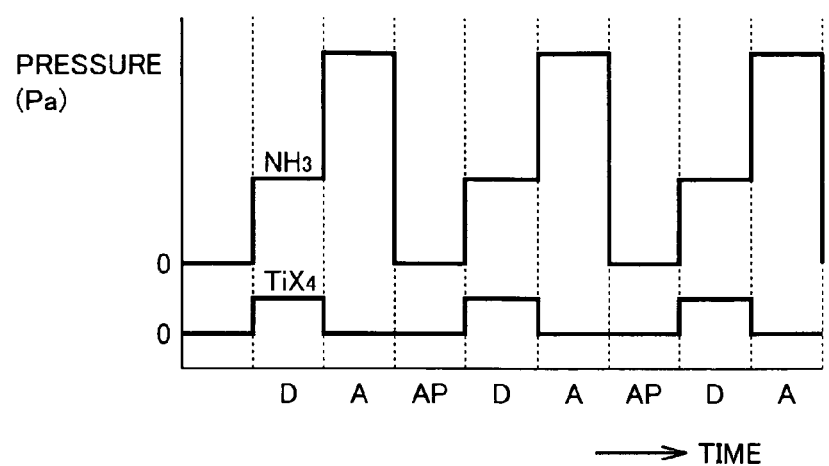
FIG. 1 is a schematic diagram representing a manufacturing method of a semiconductor device according to the present invention.

Referring to FIG. 1, a manufacturing method of a semiconductor device according to the present invention is a manufacturing method of a semiconductor device including a TiN film, including a deposition step (D step) of forming a TiN film by the CVD method, an anneal step (A step) of performing a heat treatment to the formed TiN film in an ammonium ($NH_3$) gas atmosphere, an $NH_3$ gas purge step (AP step) of purging $NH_3$ gas, and a step of further repeating the deposition step, the anneal step, and the $NH_3$ gas purge step for at least one time. The deposition step is performed using titanium halide gas and $NH_3$ gas as material gases, and under a condition of a deposition temperature of 300° C.-450° C., a deposition pressure of 10 Pa-100 Pa, a partial pressure of titanium halide gas of 1 Pa-10 Pa, and a partial pressure of $NH_3$ gas of 9 Pa-99 Pa. The TiN film is formed by a thickness of 1 nm-5 nm for each deposition step, and the anneal step is performed for 2 seconds to 60 seconds. With such a condition, generation of irregularly grown objects can be suppressed in forming a TiN film. Particularly, it is effective to set the thickness of the TiN film for each deposition step to at most 5 nm and to provide the anneal step after the deposition step, for suppressing irregular growth of the TiN film.

In the deposition step, titanium halide gas and $NH_3$ gas are used as material gases. They are the materials that enable deposition of a TiN film with a lowered deposition temperature. As titanium halide gas, titanium tetrachloride ($TiCl_4$) gas, titanium tetraiodide ($TiI_4$) gas or the like is preferably used.

The deposition temperature in the deposition step is 300° C.-450° C. A continued TiN film cannot be formed at a temperature lower than 300° C., whereas reduction of the dielectric layer of a capacitor occurs when forming an upper electrode of the capacitor and the leakage current of the capacitor increases at a temperature above 450° C. At a temperature above 400° C., crystallization of a gate insulation layer occurs when forming the gate electrode of a transistor, and the leakage current of the transistor increases. From such a viewpoint, preferably the deposition temperature is 300° C.-400° C.

The deposition pressure in the deposition step is 10 Pa-100 Pa. The deposition rate decreases at the pressure lower than 10 Pa, whereas the surface morphology becomes coarse and irregularly grown objects tend to be generated at the pressure above 100 Pa. From such a viewpoint, 25 Pa-50 Pa is preferable. Such pressure can be achieved by titanium halide gas and $NH_3$ gas that are the material gases, and inert gases of argon (Ar) gas, helium (He) gas, nitride gas ($N_2$) or the like as a dilution gas. Here, in the CVD method, while $N_2$ gas is also employed as a material gas for supplying nitrogen when the deposition temperature is high, it serves as an inert gas at a low temperature (300° C. -450° C.) as in the present invention.

The partial pressure of titanium halide gas in the deposition step is 1 Pa-10 Pa. The deposition rate decreases at the pressure lower than 1 Pa, whereas irregularly grown objects tend to be generated at the pressure above 10 Pa. From such a viewpoint, preferably the partial pressure of titanium halide gas is 2.5 Pa-5 Pa. The partial pressure of $NH_3$ gas in the deposition step is 9 Pa-99 Pa. The deposition rate decreases at the pressure less than 9 Pa, whereas irregularly grown objects tend to be generated at the pressure above 99 Pa. From such a viewpoint, preferably the partial pressure of $NH_3$ gas is 22.5 Pa-45 Pa.

The thickness of the TiN film formed for each deposition step is 1 nm-5 nm. The leakage current of the capacitor or the transistor increases with the thickness less than 1 nm, whereas irregularly grown objects tend to be generated with the thickness more than 5 nm. From such a viewpoint, preferably the thickness of the TiN film formed for each deposition step is 2.5 nm -5 nm.

The anneal time in the anneal step is 2 seconds to 60 seconds. Adhesion of the TiN film decreases and the film tends to fall off with the time less than 2 seconds, whereas reduction of the dielectric layer or the insulation layer occurs and the leakage current of the capacitor or the transistor increases with the time more than 60 seconds. From such a viewpoint, preferably the anneal time is 5 seconds to 30 seconds.

Though an anneal pressure and an anneal temperature in the anneal step are not specifically restricted, preferably at least one of the anneal pressure and the anneal temperature is greater than the deposition pressure and the deposition temperature in the deposition step, respectively. By setting at least the anneal pressure higher than the deposition pressure, or the anneal temperature higher than the deposition temperature, removal of an impurity such as halogen in the TiN film is facilitated, and generation of irregularly grown objects can further be suppressed. Here, preferably the anneal pressure is 5 to 20 times as great as the deposition pressure. The effect of suppressing the irregular growth is small at the pressure lower than five times of the deposition pressure, whereas reduction of the dielectric layer or the insulation layer occurs and the leakage current of the capacitor or the transistor tends to increase at the pressure higher than 20 times of the deposition pressure.

The anneal step is performed in an atmosphere of $NH_3$ gas. An inert gas of Ar gas, He gas, $N_2$ gas or the like can be used along with $NH_3$ gas. Here, preferably the ratio of the partial pressure of $NH_3$ gas to the anneal pressure is 0.5-1.0. The effect of suppressing the irregular growth is small if the ratio of the partial pressure of $NH_3$ gas to the anneal pressure is less than 0.5. Preferably, the anneal temperature is higher than the deposition temperature by 25° C.-150° C. The effect of suppressing the irregular growth is small if the difference from the deposition temperature is less than 25° C., whereas reduction of the dielectric layer or the insulation layer occurs and the leakage current of the capacitor or the transistor tends to increase if the difference is more than 150° C.

As for the NH₃ gas purge step, though the method for purging NH₃ gas is not specifically restricted, preferably the NH₃ gas purge step is a purge step by an inert gas or a purge step by pressure reduction. Either step can effectively purge NH₃ gas. In the step of purging NH₃ gas by an inert gas, though the pressure and the flow rate of the inert gas is not specifically restricted, greater gas pressure and greater flow rate can effectively purge NH₃ gas. Here, as described above, preferably Ar gas, He gas, N₂ gas or the like is employed as the inert gas. In the step of purging NH₃ gas by pressure reduction, though the degree of pressure reduction is not specifically restricted as long as it is smaller than the anneal pressure, preferably it is at most 100 Pa, and more preferably it is at most 10 Pa.

Comparing the step of purging by an inert gas and the step of purging by pressure reduction in the NH₃ gas purge step, the latter can purge NH₃ gas more effectively than the former, but the pressure and temperature variations in the system are greater. Accordingly, a step more appropriate than the other can be selected in accordance with the specification of a semiconductor device to be a product, the manufacturing method thereof, and the condition or constraint of a manufacturing apparatus.

The NH₃ gas purge step can include a purge step by an inert gas and a purge step by pressure reduction. By performing the purge step by an inert gas and the purge step by pressure reduction, NH₃ gas purge efficiency can be improved, and the pressure and temperature variations in the system can be suppressed by reducing the pressure reduction time.

Second Embodiment

Figure 2:
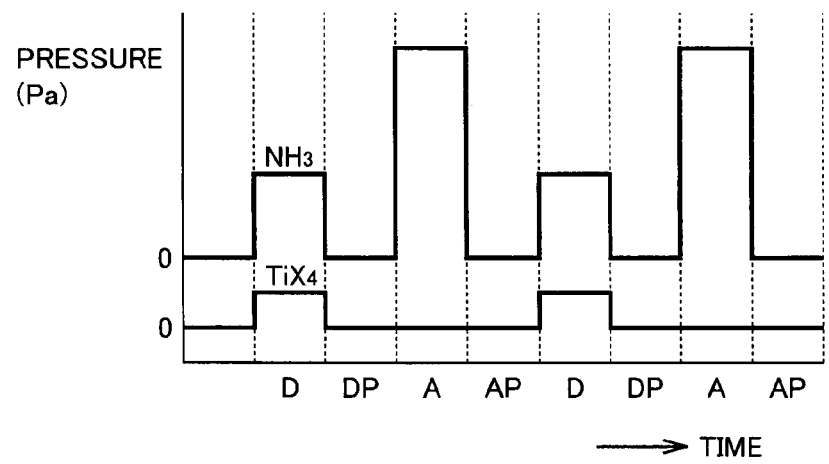
FIG. 2 is a schematic diagram representing another manufacturing method of a semiconductor device according to the present invention.

Referring to FIG. 2, another manufacturing method of a semiconductor device according to the present invention is a manufacturing method of a semiconductor device including a TiN film, including a deposition step (D step) of forming a TiN film by the CVD method, a material gas purge step (DP step) of purging a material gas, an anneal step (A step) of performing a heat treatment to the formed TiN film in an ammonium (NH₃) gas atmosphere, an NH₃ gas purge step (AP step) of purging NH₃ gas, and a step of further repeating the deposition step, the material gas purge step, the anneal step, and the NH₃ gas purge step for at least one time. The deposition step is performed using titanium halide gas and NH₃ gas as material gases, and under a condition of a deposition temperature of 300° C. -450° C., a deposition pressure of 10 Pa-100 Pa, a partial pressure of titanium halide gas of 1 Pa-10 Pa, and a partial pressure of NH₃ gas of 9 Pa-99 Pa. The TiN film is formed by a thickness of 1 nm-5 nm for each deposition step, and the anneal step is performed for 2 seconds to 60 seconds.

Since the anneal step is performed following the deposition step, titanium halide gas that is a material gas remains at the early stage of the anneal step, which may react with NH₃ gas to invite the growth of the TiN film. On the other hand, in the present embodiment, by providing the material gas purge step between the deposition step and the anneal step, titanium halide gas can surely be evacuated from the system, and the thickness of the TiN film can be controlled more precisely. The conditions of the deposition step and the anneal step are the same as in the first embodiment.

In the present embodiment, similarly to the first embodiment, though an anneal pressure and an anneal temperature in the anneal step are not specifically restricted, preferably at least one of the anneal pressure and the anneal temperature is greater than the deposition pressure and the deposition temperature in the deposition step, respectively.

In the material gas purge step, though a method for purging the material gas is not specifically restricted, preferably it is a purge step by an inert gas or a purge step by pressure reduction. Either step can effectively purge the material gas. In the step of purging NH₃ gas by an inert gas, though the pressure and the flow rate of NH₃ gas is not specifically restricted, greater gas pressure and greater flow rate can effectively purge the material gas. Here, as described above, preferably Ar gas, He gas, N₂ gas or the like is employed as the inert gas. In the step of purging NH₃ gas by pressure reduction, though the degree of pressure reduction is not specifically restricted as long as it is smaller than the deposition pressure, preferably it is at most 10 Pa. It is noted that the NH₃ gas purge step is the same as in the first embodiment.

In the present embodiment, similarly to the first embodiment, the material gas purge step and the NH₃ gas purge step each may be a purge step by an inert gas or a purge step by pressure reduction. Also, at least one of the material gas purge step and the NH₃ gas purge step may be a step including a purge step by an inert gas and a purge step by pressure reduction.

Third Embodiment

Figure 3:
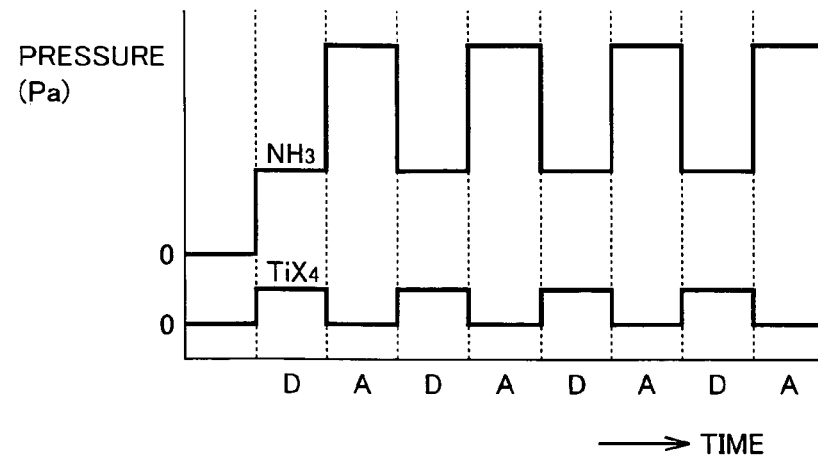
FIG. 3 is a schematic diagram representing still another manufacturing method of a semiconductor device according to the present invention.

Referring to FIG. 3, another manufacturing method of a semiconductor device according to the present invention is a manufacturing method of a semiconductor device including a TiN film, including a deposition step (D step) of forming a TiN film by the CVD method, an anneal step (A step) of performing a heat treatment to the formed TiN film in an NH₃ gas atmosphere, and a step of further repeating the deposition step and the anneal step for at least one time. The deposition step is performed using titanium halide gas and NH₃ gas as material gases, and under a condition of a deposition temperature of 300° C.-450° C., a deposition pressure of 10 Pa-100 Pa, a partial pressure of titanium halide gas of 1 Pa-10 Pa, and a partial pressure of NH₃ gas of 9 Pa-99 Pa. The TiN film is formed by a thickness of 1 nm-5 nm for each deposition step, and the anneal step is performed for 2 seconds to 60 seconds.

In the present embodiment, similarly to the first embodiment, though an anneal pressure and an anneal temperature in the anneal step are not specifically restricted, preferably at least one of the anneal pressure and the anneal temperature is greater than the deposition pressure and the deposition temperature in the deposition step, respectively.

In the first and second embodiments, if the thickness of the TiN film formed for each deposition step is made thinner and the number of deposition step and anneal step is increased, the time required for the material gas purge step after the deposition step and the NH₃ gas purge step after the anneal step is prolonged, and thus the processing capability is undesirably decreased. Accordingly, in the present embodiment, the material gas purge step after the deposition step and/or the NH₃ gas purge step after the anneal step are eliminated to improve the processing capability. On the other hand, it should be noted that as titanium halide gas and NH₃ gas are present in an uncontrollable state when switching the gases from the deposition step to the anneal step, and from the anneal step to the deposition step, accurate control of the thickness of the TiN film, resistivity or the like is difficult. Accordingly, the present embodiment is not suitable as a manufacturing method of a semiconductor device including a transistor that requires accurate control such as the thickness of the TiN film, resistivity or the like. Still, it is applicable as a manufacturing method of a semiconductor device including a capacitor that does not require accurate control such as the thickness of the TiN film, resistivity or the like.

Next, in fourth to seventh embodiments, a semiconductor device including a TiN film formed by the step included in the aforementioned manufacturing method of a semiconductor device will be described.

Fourth Embodiment

Figure 6:
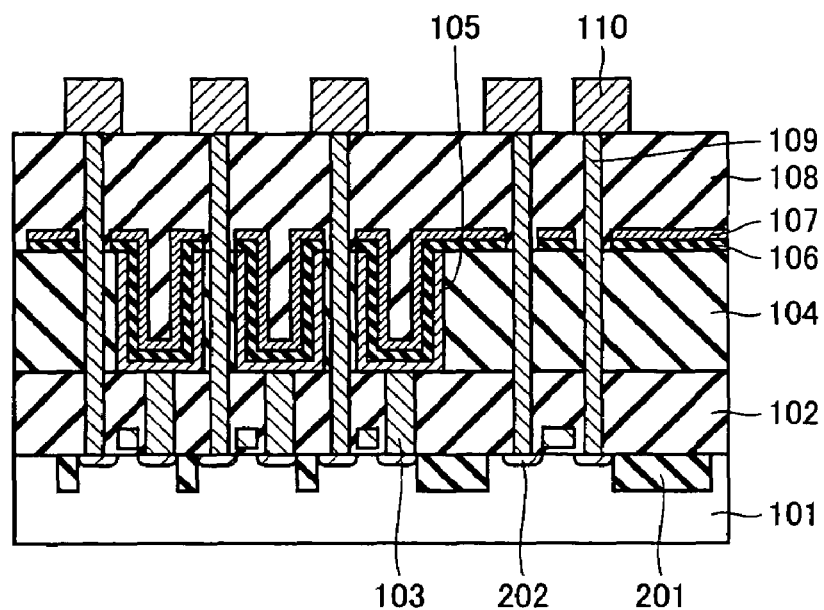
FIG. 6 is a schematic cross sectional diagram representing a semiconductor device according to the present invention.

Referring to FIG. 6, a semiconductor device according to the present invention is a semiconductor device including at least a capacitor having a lower electrode 105, a dielectric layer 106 and an upper electrode 107. Upper electrode 107 formed on dielectric layer 106 is the TiN film formed by the step included in the aforementioned manufacturing method of a semiconductor device. Specifically, as shown in FIG. 6, in the semiconductor device, a lower interlayer insulation layer 102, an interlayer insulation layer 104, and an upper interlayer insulation layer 108 are successively stacked on a silicon substrate 101, and lower electrode 105, dielectric layer 106 and upper electrode 107 constituting a capacitor are formed between interlayer insulation layer 104 and upper interlayer insulation layer 108. Lower electrode 105 and an upper interconnection layer 110 formed on upper interlayer insulation layer 108 are, independently of each other, electrically connected to an impurity diffusion region 202 that is a conductive layer formed in silicon substrate 101, via contact plug 103 and contact plug 109, respectively. Here, upper electrode 107 is electrically insulated from contact plug 103.

In this semiconductor device, upper electrode 107 is the TiN film manufactured by the aforementioned manufacturing method of a semiconductor device. In a TiN film obtained from such a manufacturing method, generation of irregularly grown objects in the TiN film is suppressed, and therefore a semiconductor device including a capacitor with less malfunction can be obtained.

Figure 10A:
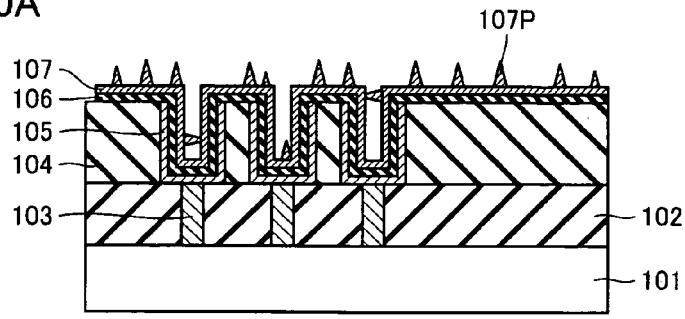
FIGS. 10A-10G represent problems when a TiN film in which irregularly grown objects are generated is employed as an upper electrode of a capacitor.
Figure 10B:
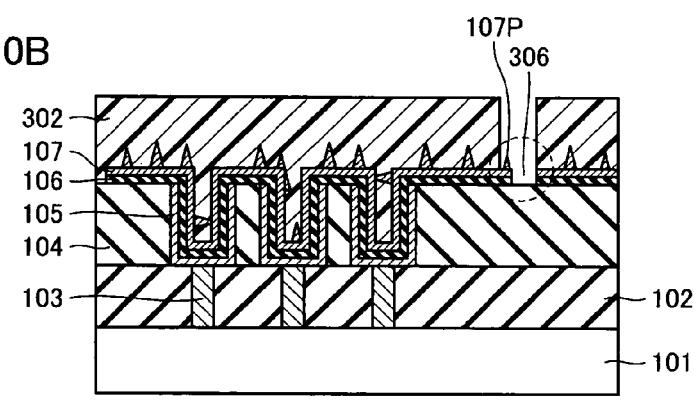
Figure 10C:
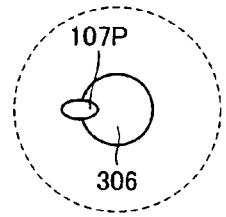
Figure 10D:
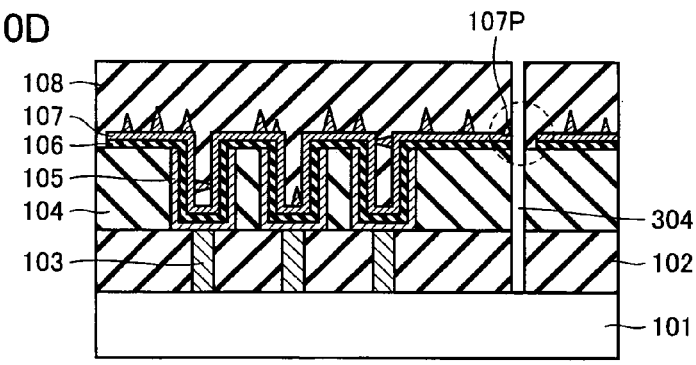
Figure 10E:
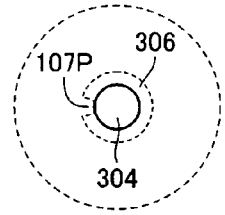
Figure 10F:
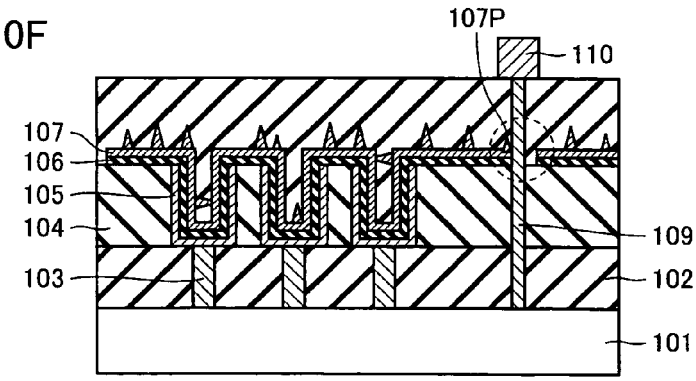
Figure 10G:
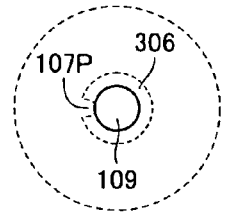

In the following, referring to FIGS. 10A-10G, problems associated with use of a TiN film in which irregularly grown objects are generated as an upper electrode will be described. For example, when a TiN film having an irregularly grown object 107P shown in FIG. 10A is used as upper electrode 107, if a pattern of a resist 302 is provided on upper electrode 107 and upper electrode 107 and dielectric layer 106 are etched so that an etching opening 306 is obtained, irregularly grown object 107P remains as an etching residue as shown in FIG. 10B. Subsequently, after resist 302 is removed and upper interlayer insulation layer 108 is formed on upper electrode 107, a plug opening 304 for making a contact plug at a prescribed position is formed. Then, a protrusion of irregularly grown object 107P is formed in plug opening 304 as shown in FIG. 10D. If a contact plug 109 is embedded inside the plug opening, contact plug 109 and upper electrode 107 are brought into an electrical conduction as shown in FIG. 10F, whereby malfunction of the semiconductor device is invited. It is noted that FIGS. 10C, 10E and 10G are enlarged illustration of FIGS. 10B, 10D and 10F, respectively, in the proximity of irregularly grown object 107P seen from the top of the semiconductor device.

As compared with a semiconductor including a conventional capacitor in which a TiN film deposited at a high temperature (600° C.) is used, the semiconductor including the capacitor having the TiN film thus obtained as the upper electrode has characteristics of a prolonged refresh cycle, reduced power consumption and the like when used as a DRAM (Dynamic Random Access Memory) device, since the leakage current is smaller.

Fifth Embodiment

Figure 7:
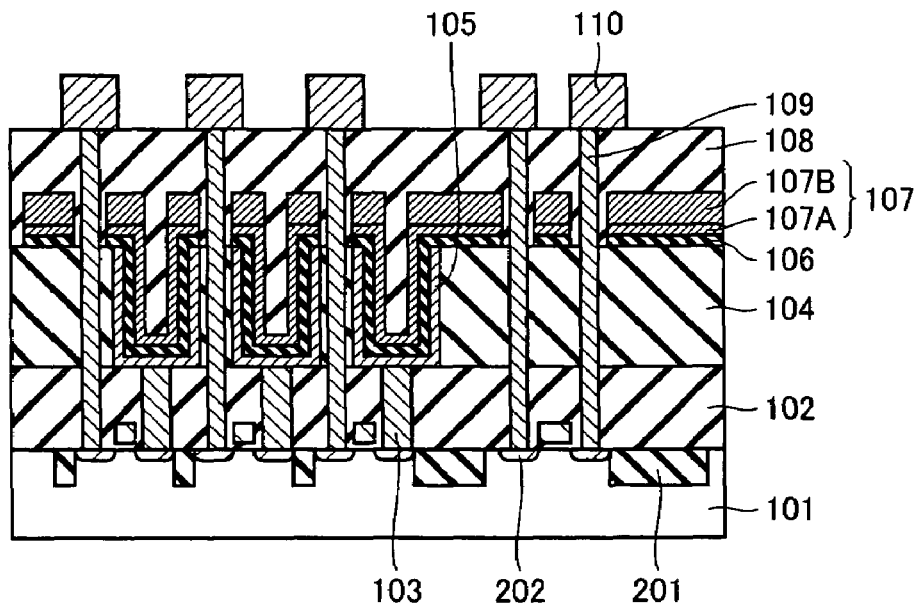
FIG. 7 is a schematic cross sectional diagram representing another semiconductor device according to the present invention.

Referring to FIG. 7, another semiconductor device according to the present invention is a semiconductor device including at least a capacitor having a lower electrode 105, a dielectric layer 106 and an upper electrode 107. Upper electrode 107 formed on dielectric layer 106 is formed by at least two electrode conductive layers, and at least one layer of the electrode conductive layers is the TiN film formed by the step included in the aforementioned manufacturing method of a semiconductor device. Particularly, it is a semiconductor device in which an adjacent electrode conductive layer 107A among the at least two electrode conductive layers that is adjacent to dielectric layer 106 is the TiN film formed by the step included in the aforementioned manufacturing method of a semiconductor device.

A crack tends to occur in the TiN film formed by the step included in the aforementioned manufacturing method of a semiconductor device due to an internal stress of the film if the thickness is great, preferably the thickness of the TiN film is at most 100 nm. On the other hand, when it is required to further reduce the interconnection resistance, the thickness of the upper electrode must be increased. Thus, when a semiconductor device with an upper electrode having a thickness of more than 100 nm is required, it is a highly effective method to form the upper electrode as electrode conductive layers of at least two layers and to set the thickness of the TiN film formed by the step included in the aforementioned manufacturing method to at most 100 nm. Here, referring to FIG. 7, when a TiN film of 20 nm thickness is formed by the aforementioned manufacturing method that is the CVD method is formed as adjacent electrode conductive layer 107A in upper electrode 107, and a TiN film of 100 nm thickness is formed by a sputtering method as electrode conductive layer 107B in upper electrode 107, the sheet resistivity of adjacent electrode conductive layer 107A is about 1 kΩ/□ (ohms-per-square) whereas the sheet resistivity of adjacent electrode conductive layer 107B is 2 Ω/□ the combined sheet resistivity as upper electrode 107 can be reduced to at most 2 Ω/□. In FIG. 7, while adjacent electrode conductive layer 107B formed by the sputtering method is formed only on the top horizontal portion of adjacent electrode conductive layer 107A formed by the CVD method, it may be formed on the vertical portion and bottom horizontal portion of adjacent electrode conductive layer 107A depending on the coverage characteristics of the sputtering method.

When upper electrode 107 is formed by at least two electrode conductive layers, by at least one layer of the electrode conductive layers, particularly adjacent electrode conductive layer 107A among the at least two electrode conductive layers that is adjacent to dielectric layer 106, being the TiN film in which generation of the irregularly grown objects is suppressed, a semiconductor device including a capacitor with less malfunction can be obtained.

Sixth Embodiment

Figure 8:
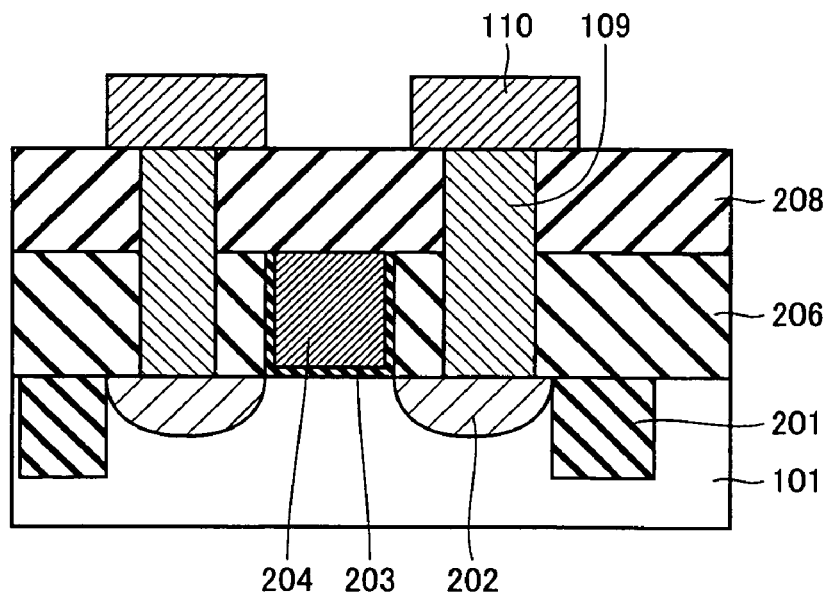
FIG. 8 is a schematic cross sectional diagram representing still another semiconductor device according to the present invention.

Referring to FIG. 8, still another semiconductor device according to the present invention is a semiconductor device including at least a transistor having a gate insulation layer 203 and a gate electrode 204. Gate electrode 204 formed on gate insulation layer 203 is the TiN film formed by the step included in the aforementioned manufacturing method of a semiconductor device. Specifically, in the semiconductor device, an interlayer insulation layer 206 and an upper interlayer insulation layer 208 are successively stacked on a silicon substrate 101, and gate insulation layer 203 and gate electrode 204 are formed between interlayer insulation layer 206 and upper interlayer insulation layer 208. An upper interconnection layer 110 formed on upper interlayer insulation layer 208 is electrically connected to an impurity diffusion region 202 that is a conductive layer formed in silicon substrate 101 via a contact plug 109. Here, normally a high dielectric material of $HfO_2$ or the like is employed as gate insulation layer 203, and therefore a TiN film forming process of at most 400° C. is preferable in order to suppress crystallization of the gate insulation layer. Manufacturing the TiN film according to the aforementioned manufacturing method of a semiconductor device, crystallization of the gate insulation layer can be suppressed, and a transistor with small leakage current can be obtained.

Seventh Embodiment

Figure 9:
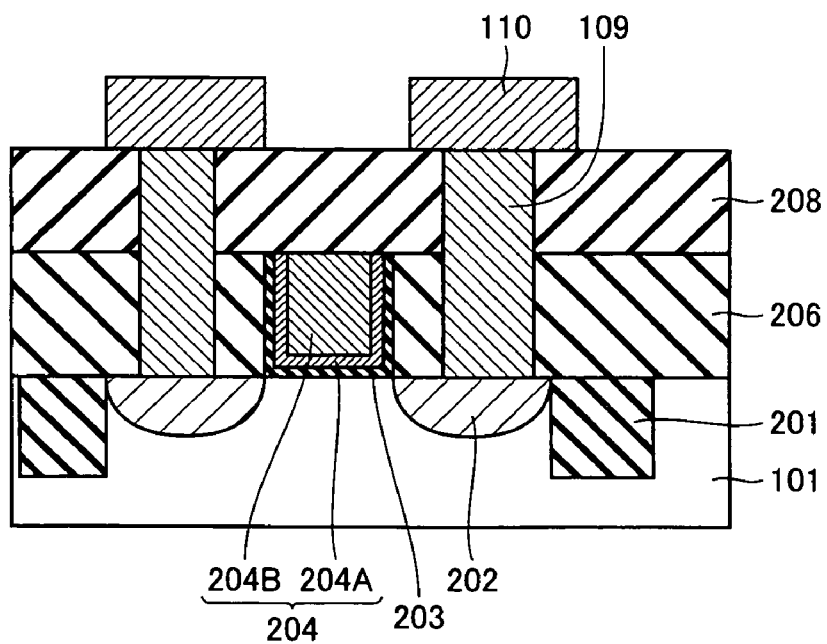
FIG. 9 is a schematic cross sectional diagram representing still another semiconductor device according to the present invention.

Referring to FIG. 9, still another semiconductor device according to the present invention is a semiconductor device including at least a transistor having a gate insulation layer 203 and a gate electrode 204. Gate electrode 204 formed on gate insulation layer 203 is formed by at least two gate conductive layers, and at least one layer of the gate conductive layers is the TiN film formed by the step included in the aforementioned manufacturing method of a semiconductor device. Particularly, it is characterized in that adjacent gate conductive layer 204A among the at least two gate conductive layers that is adjacent to gate insulation layer 203 is the TiN film formed by the step included in the aforementioned manufacturing method of the semiconductor device.

When the gate electrode is formed by at least two gate conductive layers, by forming at least one layer of the gate conductive layers, particularly the TiN film of adjacent gate conductive layer 204A among the at least two gate conductive layers that is adjacent to gate insulation layer 203 by the step included in the aforementioned manufacturing method of the semiconductor device, crystallization of the gate insulation layer can be suppressed, and a transistor with small leakage current can be obtained.

Figure 11:
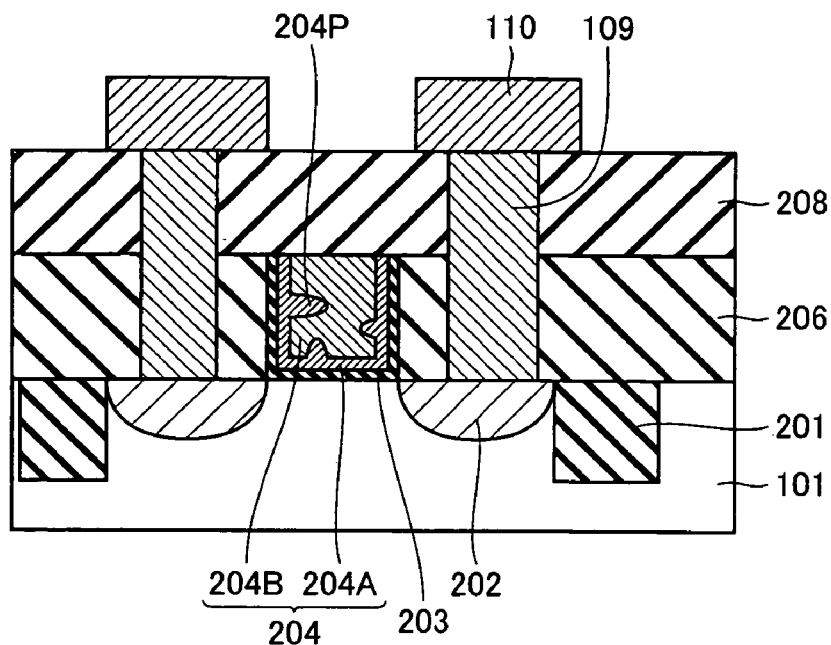
FIG. 11 represents problems when a TiN film in which irregularly grown objects are generated is employed as a gate electrode of a transistor.

In the following, referring to FIG. 11, problems associated with use of a TiN film in which irregularly grown objects are generated as adjacent electrode conductive layer 204A of gate electrode 204 will be described. As shown in FIG. 11, when a TiN film having an irregularly grown object 204P is used as adjacent electrode conductive layer 204A, if W (tungsten) is embedded as gate conductive layer 204B of gate electrode 204, the cross section of W that is gate conductive layer 204B is reduced at the portion where irregularly grown object 204P is present in the TiN film and current focuses to W having smaller electric resistance as compared to TiN, whereby the electromigration life is significantly reduced. Accordingly, when the gate electrode is formed by at least two gate conductive layers, by at least one layer of these gate conductive layers being a TiN film without the aforementioned irregularly grown object, such a problem can be overcome.

EXAMPLES

The manufacturing method of a semiconductor device according to the present invention will further be described specifically, based on examples.

Comparative Example 1

A TiN film of 25 nm thickness was formed in the deposition step (D step) by the CVD method, with the condition of a deposition temperature of 350° C., a deposition pressure of 50 Pa (where $TiCl_4$ partial pressure is 5 Pa, $NH_3$ partial pressure is 45 Pa), a $TiCl_4$ flow rate of 50 sccm (sccm is a unit expressing flow rate ($cm^3$/min) in the standard state (0° C., 1013 hPa)) and an $NH_3$ flow rate of 500 sccm. In the next anneal step (A step), annealing was performed with the condition of an anneal temperature of 350° C., an annealing pressure of 50 Pa (where $NH_3$ pressure is 50 Pa), and an $NH_3$ flow rate of 500 sccm, for 30 seconds. As the first step (AP1 step) in the next $NH_3$ gas purge step, purging of $NH_3$ gas was performed using $N_2$ gas at a pressure of 50 Pa for 30 seconds. Further, as the next step (AP2 step) in the $NH_3$ gas purge step, pressure reduction was performed for 30 seconds using pressure reduction pump to establish a pressure of 10 Pa. Observing the surface of the TiN film thus obtained with a scanning electron microscope (hereinafter referred to as SEM), numerous irregularly grown objects were generated that appear white as shown in FIG. 13. The leakage current characteristics of a semiconductor device including a capacitor having the TiN film as an upper electrode is indicated by a dashed line in FIG. 12.

Example 1

Figure 4:
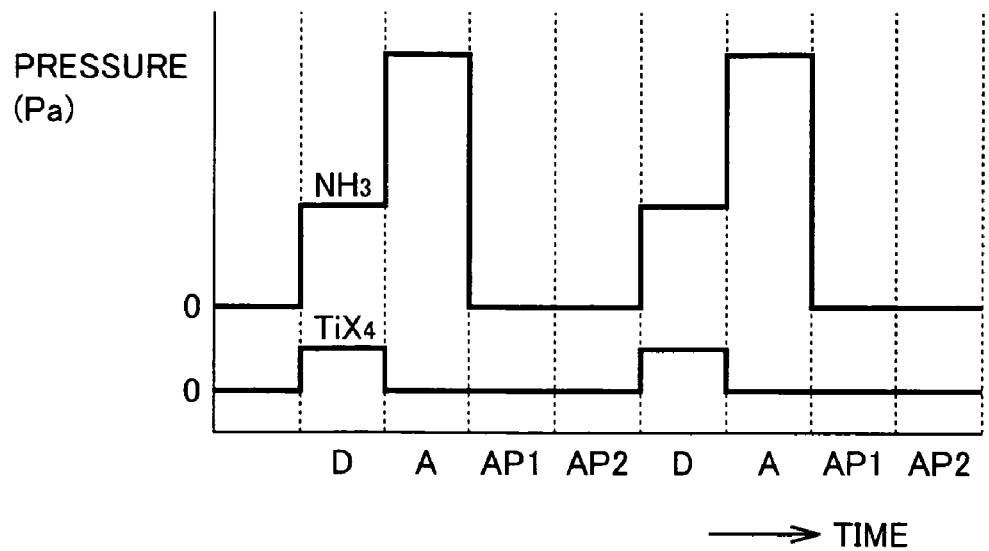
FIG. 4 is a schematic diagram representing still another manufacturing method of a semiconductor device according to the present invention.
Figure 14:
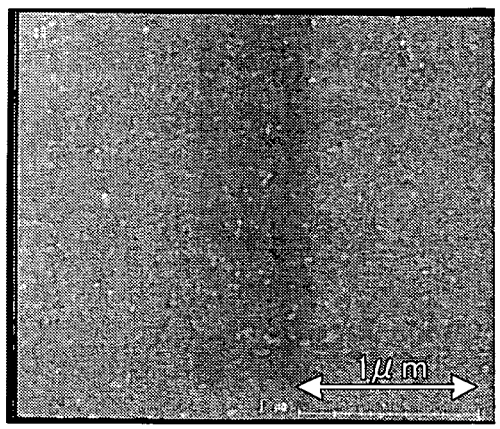
FIG. 14 is an SEM photograph of a TiN film obtained through a manufacturing method of a semiconductor device according to the present invention.

Referring to FIG. 4, a TiN film of 5 nm thickness was formed in the deposition step (D step) by the CVD method, with the condition of a deposition temperature of 350° C., a deposition pressure of 50 Pa (where $TiCl_4$ partial pressure is 5 Pa, $NH_3$ partial pressure is 45 Pa), a $TiCl_4$ flow rate of 50 sccm and an $NH_3$ flow rate of 500 sccm. In the next anneal step (A step), annealing was performed with the condition of an anneal temperature of 350° C., an annealing pressure of 50 Pa (where $NH_3$ pressure is 50 Pa), and an $NH_3$ flow rate of 500 sccm, for 30 seconds. As the first step (AP1 step) in the next $NH_3$ gas purge step, purging of $NH_3$ gas was performed using $N_2$ gas at a pressure of 50 Pa for 30 seconds. Further, as the next step (AP2 step) in the $NH_3$ gas purge step, pressure reduction was performed for 30 seconds using pressure reduction pump to establish a pressure of 10 Pa. The aforementioned deposition step, anneal step and $NH_3$ gas purge step were further repeated for four times, to form a TiN film of 25 nm thickness. Observing the surface of the TiN film by SEM, it was found that the generation of irregularly grown objects was suppressed, as shown in FIG. 14.

Example 2

Figure 15:
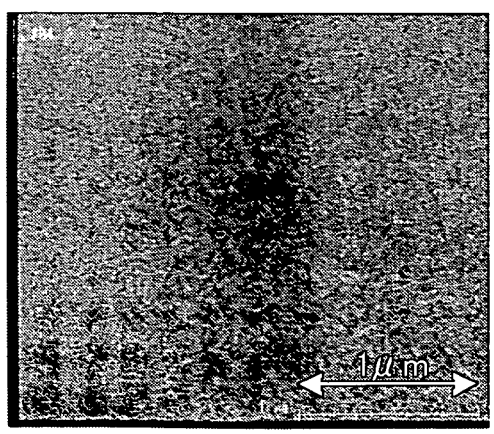
FIG. 15 is an SEM photograph of another TiN film obtained through a manufacturing method of a semiconductor device according to the present invention.

Referring to FIG. 4, a TiN film of 5 nm thickness was formed in the deposition step (D step) by the CVD method, with the condition of a deposition temperature of 350° C., a deposition pressure of 50 Pa (where $TiCl_4$ partial pressure is 5 Pa, $NH_3$ partial pressure is 45 Pa), a $TiCl_4$ flow rate of 50 sccm and an $NH_3$ flow rate of 500 sccm. In the next anneal step (A step), annealing was performed with the condition of an anneal temperature of 400° C., an annealing pressure of 400 Pa (where $NH_3$ pressure is 400 Pa), and an $NH_3$ flow rate of 500 sccm, for 30 seconds. As the first step (AP1 step) in the next $NH_3$ gas purge step, purging of $NH_3$ gas was performed using $N_2$ gas at a pressure of 400 Pa for 30 seconds. Further, as the next step (AP2 step) in the $NH_3$ gas purge step, pressure reduction was performed for 30 seconds using pressure reduction pump to establish a pressure of 50 Pa. The aforementioned deposition step, anneal step and $NH_3$ gas purge step (a purge step by $N_2$ gas and a purge step by pressure reduction) were further repeated for four times, to form a TiN film of 25 nm thickness. Observing the surface of the TiN film by SEM, it was found that the generation of irregularly grown objects was further suppressed, as shown in FIG. 15.

Figure 12:
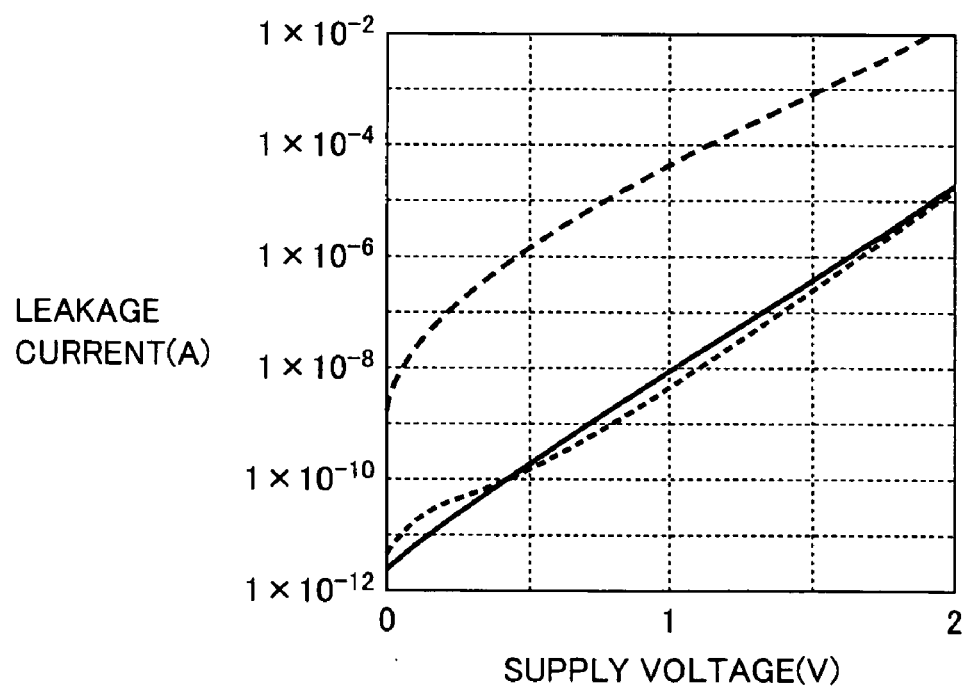
FIG. 12 represents leakage current characteristics of a semiconductor device including a capacitor.
Figure 13:
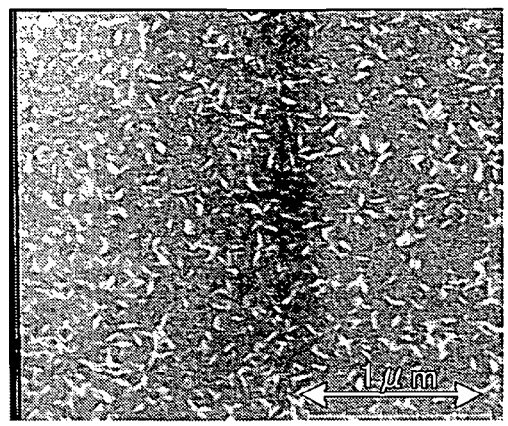
FIG. 13 is an SEM photograph of a TiN film obtained through a manufacturing method of a semiconductor device different from the present invention.

The leakage current characteristics of a semiconductor device including a capacitor having the TiN film as an upper electrode is indicated by a solid line in FIG. 12. It is noted that the dashed line in FIG. 12 indicates the leakage current characteristics of a semiconductor device including a capacitor having the TiN film as an upper electrode, which TiN film was formed as in the first embodiment except that the deposition temperature was 600° C. As can be seen from FIG. 12, the leakage current of the semiconductor devices of Example 2 and Comparative Example 1 in which TiN film was formed at the deposition temperature of 350° C. was smaller than the leakage current of the semiconductor device in which the TiN film was formed at the deposition temperature of 600° C., exhibiting excellent leakage current characteristics.

Example 3

Figure 5:
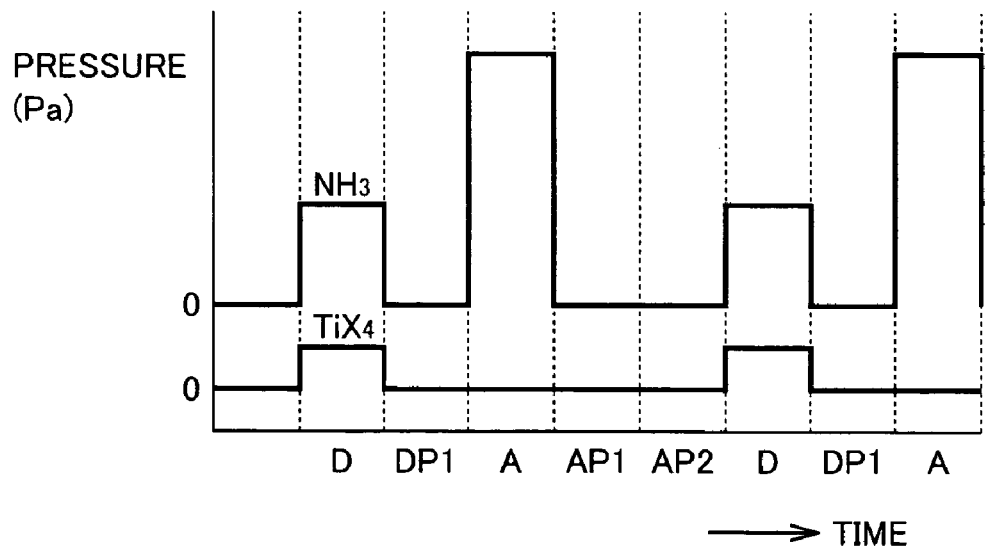
FIG. 5 is a schematic diagram representing still another manufacturing method of a semiconductor device according to the present invention.

Referring to FIG. 5, a TiN film of 5 nm thickness was formed in the deposition step (D step) by the CVD method, with the condition of a deposition temperature of 350° C., a deposition pressure of 50 Pa (where $TiCl_4$ partial pressure is 5 Pa, $NH_3$ partial pressure is 45 Pa), a $TiCl_4$ flow rate of 50 sccm and an $NH_3$ flow rate of 500 sccm. In the next material gas purge step (DP step), purging of $NH_3$ gas was performed using $N_2$ gas at a pressure of 50 Pa for 30 seconds. In the next anneal step (A step), annealing was performed with the condition of an anneal temperature of 400° C., an annealing pressure of 400 Pa (where $NH_3$ pressure is 400 Pa), and an $NH_3$ flow rate of 500 sccm, for 30 seconds. As the first step (AP1 step) in the next $NH_3$ gas purge step, purging of $NH_3$ gas was performed using $N_2$ gas at a pressure of 400 Pa for 30 seconds. Further, as the next step (AP2 step) in the $NH_3$ gas purge step, pressure reduction was performed for 30 seconds using pressure reduction pump to establish a pressure of 50 Pa. The aforementioned deposition step, anneal step and $NH_3$ gas purge step (a purge step by $N_2$ gas and a purge step by pressure reduction) were further repeated for four times, to form a TiN film of 25 nm thickness. Observing the surface of the TiN film by SEM, it was found that the generation of irregularly grown objects was suppressed, similarly to Example 2.

As above, the present invention can widely be utilized in a semiconductor device including a TiN film and a manufacturing method thereof for providing a semiconductor device in which generation of irregularly grown objects in the TiN film is suppressed and a manufacturing method thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device including a titanium nitride film, comprising:
    a deposition step of forming a titanium nitride film by a chemical vapor deposition method;
    an anneal step of performing a heat treatment to the formed titanium nitride film in an atmosphere of ammonium gas;
    an ammonium gas purge step of purging said ammonium gas; and
    a step of further repeating said deposition step, said anneal step, and said ammonium gas purge step for at least one time, wherein
    said deposition step is performed using titanium halide gas and ammonium gas as material gases, and under a condition of a deposition temperature of 300° C.-450° C., a deposition pressure of 10 Pa-100 Pa, a partial pressure of titanium halide gas of 1 Pa-10 Pa, and a partial pressure of ammonium gas of 9 Pa-99 Pa, said titanium nitride film is formed by a thickness of 1 nm-5 nm for each said deposition step,
    said anneal step is performed for 2 seconds to 60 seconds, and
    said anneal step uses at least one of an anneal pressure 5 to 20 times as great as said deposition pressure and an anneal temperature higher than said deposition temperature by 25° C. -150° C.

2. The manufacturing method of a semiconductor device according to claim 1, wherein
    aid ammonium gas purge step is a purge step by an inert gas or a purge step by pressure reduction.

3. The manufacturing method of a semiconductor device according to claim 1, wherein
    said ammonium gas purge step includes a purge step by an inert gas and a purge step by pressure reduction.

4. A semiconductor device comprising at least a capacitor having a lower electrode, a dielectric layer and an upper electrode, wherein
    said upper electrode formed on said dielectric layer is said titanium nitride film formed by said step included in the manufacturing method of a semiconductor device according to claim 1.

5. A semiconductor device comprising at least a capacitor having a lower electrode, a dielectric layer and an upper electrode, wherein
    said upper electrode formed on said dielectric layer is formed by at least two electrode conductive layers, and at least one layer of said electrode conductive layers is said titanium nitride film formed by said step included in the manufacturing method of a semiconductor device according to claim 1.

6. A semiconductor device comprising at least a capacitor having a lower electrode, a dielectric layer and an upper electrode, wherein
    said upper electrode formed on said dielectric layer is formed by at least two electrode conductive layers, and an adjacent electrode conductive layer among said electrode conductive layers that is adjacent to said dielectric layer is said titanium nitride film formed by said step included in the manufacturing method of a semiconductor device according to claim 1.

7. A semiconductor device comprising at least a transistor having a gate insulation layer and a gate electrode, wherein
    said gate electrode formed on said gate insulation layer is said titanium nitride film formed by said step included in the manufacturing method of a semiconductor device according to claim 1.

8. A semiconductor device comprising at least a transistor having a gate insulation layer and a gate electrode, wherein
    said gate electrode formed on said gate insulation layer is formed by at least two gate conductive layers, and at least one layer of said gate conductive layers is said titanium nitride film formed by said step included in the manufacturing method of a semiconductor device according to claim 1.

9. A semiconductor device comprising at least a transistor having a gate insulation layer and a gate electrode, wherein
    said gate electrode formed on said gate insulation layer is formed by at least two gate conductive layers, and an adjacent gate conductive layer among said gate conductive layers that is adjacent to said gate insulation layer is said titanium nitride film formed by said step included in the manufacturing method of a semiconductor device according to claim 1.

10. A manufacturing method of a semiconductor device including a titanium nitride film, comprising:
- a deposition step of forming a titanium nitride film by a chemical vapor deposition method;
- a material gas purge step of purging a material gas;
- an anneal step of performing a heat treatment to the formed titanium nitride film in an atmosphere of ammonium gas;
- an ammonium gas purge step of purging said ammonium gas; and
- a step of further repeating said deposition step, said material gas purge step, said anneal step, and said ammonium gas purge step for at least one time,
- wherein said deposition step is performed using titanium halide gas and ammonium gas as material gases, and under a condition of a deposition temperature of 300° C.-450° C., a deposition pressure of 10 Pa-100 Pa, a partial pressure of titanium halide gas of 1 Pa-10 Pa, and a partial pressure of ammonium gas of 9 Pa-99 Pa, said titanium nitride film is formed by a thickness of 1 nm-5 nm for each said deposition step,
- said anneal step is performed for 2 seconds to 60 seconds, and
- said anneal step uses at least one of an anneal pressure 5 to 20 times as great as said deposition pressure and an anneal temperature higher than said deposition temperature by 25° C.-150° C.

11. The manufacturing method of a semiconductor device according to claim 10, wherein
each of said material gas purge step and said ammonium gas purge step is a purge step by an inert gas or a purge step by pressure reduction.

12. The manufacturing method of a semiconductor device according to claim 10, wherein
at least one of said material gas purge step and said ammonium gas purge step includes a purge step by an inert gas and a purge step by pressure reduction.

13. A semiconductor device comprising at least a capacitor having a lower electrode, a dielectric layer and an upper electrode, wherein
said upper electrode formed on said dielectric layer is said titanium nitride film formed by said step included in the manufacturing method of a semiconductor device according to claim 10.

14. A semiconductor device comprising at least a capacitor having a lower electrode, a dielectric layer and an upper electrode, wherein
said upper electrode formed on said dielectric layer is formed by at least two electrode conductive layers, and at least one layer of said electrode conductive layers is said titanium nitride film formed by said step included in the manufacturing method of a semiconductor device according to claim 10.

15. A semiconductor device comprising at least a capacitor having a lower electrode, a dielectric layer and an upper electrode, wherein
said upper electrode formed on said dielectric layer is formed by at least two electrode conductive layers, and an adjacent electrode conductive layer among said electrode conductive layers that is adjacent to said dielectric layer is said titanium nitride film formed by said step included in the manufacturing method of a semiconductor device according to claim 10.

16. A semiconductor device comprising at least a transistor having a gate insulation layer and a gate electrode, wherein
said gate electrode formed on said gate insulation layer is said titanium nitride film formed by said step included in the manufacturing method of a semiconductor device according to claim 10.

17. A semiconductor device comprising at least a transistor having a gate insulation layer and a gate electrode, wherein
said gate electrode formed on said gate insulation layer is formed by at least two gate conductive layers, and at least one layer of said gate conductive layers is said titanium nitride film formed by said step included in the manufacturing method of a semiconductor device according to claim 10.

18. A semiconductor device comprising at least a transistor having a gate insulation layer and a gate electrode, wherein
said gate electrode formed on said gate insulation layer is formed by at least two gate conductive layers, and an adjacent gate conductive layer among said gate conductive layers that is adjacent to said gate insulation layer is said titanium nitride film formed by said step included in the manufacturing method of a semiconductor device according to claim 10.

19. A manufacturing method of a semiconductor device including a titanium nitride film, comprising:
- a deposition step of forming a titanium nitride film by a chemical vapor deposition method;
- an anneal step of performing a heat treatment to the formed titanium nitride film in an atmosphere of ammonium gas; and
- a step of further repeating said deposition step and said anneal step for at least one time,
- wherein said deposition step is performed using titanium halide gas and ammonium gas as material gases, and under a condition of a deposition temperature of 300° C.-450° C., a deposition pressure of 10 Pa-100 Pa, a partial pressure of titanium halide gas of 1 Pa-10 Pa, and a partial pressure of ammonium gas of 9 Pa-99 Pa, said titanium nitride film is formed by a thickness of 1 nm-5 nm for each said deposition step,
- said anneal step is performed for 2 seconds to 60 seconds, and
- said anneal step uses at least one of an anneal pressure 5 to 20 times as great as said deposition pressure and an anneal temperature higher than said deposition temperature by 25° C.-150° C.

20. A semiconductor device comprising at least a capacitor having a lower electrode, a dielectric layer and an upper electrode, wherein
said upper electrode formed on said dielectric layer is said titanium nitride film formed by said step included in the manufacturing method of a semiconductor device according to claim 19.

21. A semiconductor device comprising at least a capacitor having a lower electrode, a dielectric layer and an upper electrode, wherein
said upper electrode formed on said dielectric layer is formed by at least two electrode conductive layers, and at least one layer of said electrode conductive layers is said titanium nitride film formed by said step included in the manufacturing method of a semiconductor device according to claim 19.

22. A semiconductor device comprising at least a capacitor having a lower electrode, a dielectric layer and an upper electrode, wherein
said upper electrode formed on said dielectric layer is formed by at least two electrode conductive layers, and an adjacent electrode conductive layer among said electrode conductive layers that is adjacent to said dielectric layer is said titanium nitride film formed by said step included in the manufacturing method of a semiconductor device according to claim 19.

23. A semiconductor device comprising at least a transistor having a gate insulation layer and a gate electrode, wherein said gate electrode formed on said gate insulation layer is said titanium nitride film formed by said step included in the manufacturing method of a semiconductor device according to claim 19.

24. A semiconductor device comprising at least a transistor having a gate insulation layer and a gate electrode, wherein said gate electrode formed on said gate insulation layer is formed by at least two gate conductive layers, and at least one layer of said gate conductive layers is said titanium nitride film formed by said step included in the manufacturing method of a semiconductor device according to claim 19.

25. A semiconductor device comprising at least a transistor having a gate insulation layer and a gate electrode, wherein said gate electrode formed on said gate insulation layer is formed by at least two gate conductive layers, and an adjacent gate conductive layer among said gate conductive layers that is adjacent to said gate insulation layer is said titanium nitride film formed by said step included in the manufacturing method of a semiconductor device according to claim 19.

* * * * *